United States Patent
Knapp et al.

(10) Patent No.: US 12,315,733 B2
(45) Date of Patent: May 27, 2025

(54) ENHANCED ETCH SELECTIVITY USING HALIDES

(71) Applicant: Applied Materials, Inc., Santa Clara, CA (US)

(72) Inventors: David Knapp, Santa Clara, CA (US); Feng Qiao, San Jose, CA (US); Hailong Zhou, San Jose, CA (US); Junkai He, San Jose, CA (US); Qian Fu, Pleasanton, CA (US); Mark J. Saly, Santa Clara, CA (US); Jeffrey Anthis, Redwood City, CA (US); Jayoung Choi, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/429,554

(22) Filed: Feb. 1, 2024

(65) Prior Publication Data
US 2024/0266180 A1  Aug. 8, 2024

Related U.S. Application Data

(60) Provisional application No. 63/443,785, filed on Feb. 7, 2023.

(51) Int. Cl.
*H01L 21/3065* (2006.01)
*H10B 12/00* (2023.01)

(52) U.S. Cl.
CPC ......... *H01L 21/3065* (2013.01); *H10B 12/01* (2023.02)

(58) Field of Classification Search
None
See application file for complete search history.

(56) References Cited

U.S. PATENT DOCUMENTS

| | | | |
|---|---|---|---|
| 2010/0207240 A1 | 8/2010 | Hashimoto et al. | |
| 2018/0151441 A1 | 5/2018 | Lin et al. | |
| 2018/0182777 A1* | 6/2018 | Cui | H01L 21/31116 |
| 2019/0355738 A1 | 11/2019 | Zhao et al. | |
| 2020/0403033 A1* | 12/2020 | Lilak | H10B 43/50 |
| 2021/0265203 A1* | 8/2021 | Zhou | H01L 21/76877 |

FOREIGN PATENT DOCUMENTS

EP  3667712 A1  6/2020

OTHER PUBLICATIONS

International Search Report and Written Opinion for International Application No. PCT/US2024/014333, mailed Jun. 3, 2024, 08 Pages.

* cited by examiner

*Primary Examiner* — Stephanie P Duclair
(74) *Attorney, Agent, or Firm* — Lowenstein Sandler LLP

(57) ABSTRACT

A method includes performing a dry etch process to remove a portion of a first layer disposed on a second layer of a stack of alternating layers. The first layer includes a first material and the second layer includes a second material different from the first material, and the dry etch process forms a passivation layer including a byproduct on surfaces of the second material. A amount of first material of the portion of the first layer remains after performing the dry etch process, The method further includes introducing a halide gas to enhance the passivation layer on the surfaces of the second material.

20 Claims, 9 Drawing Sheets

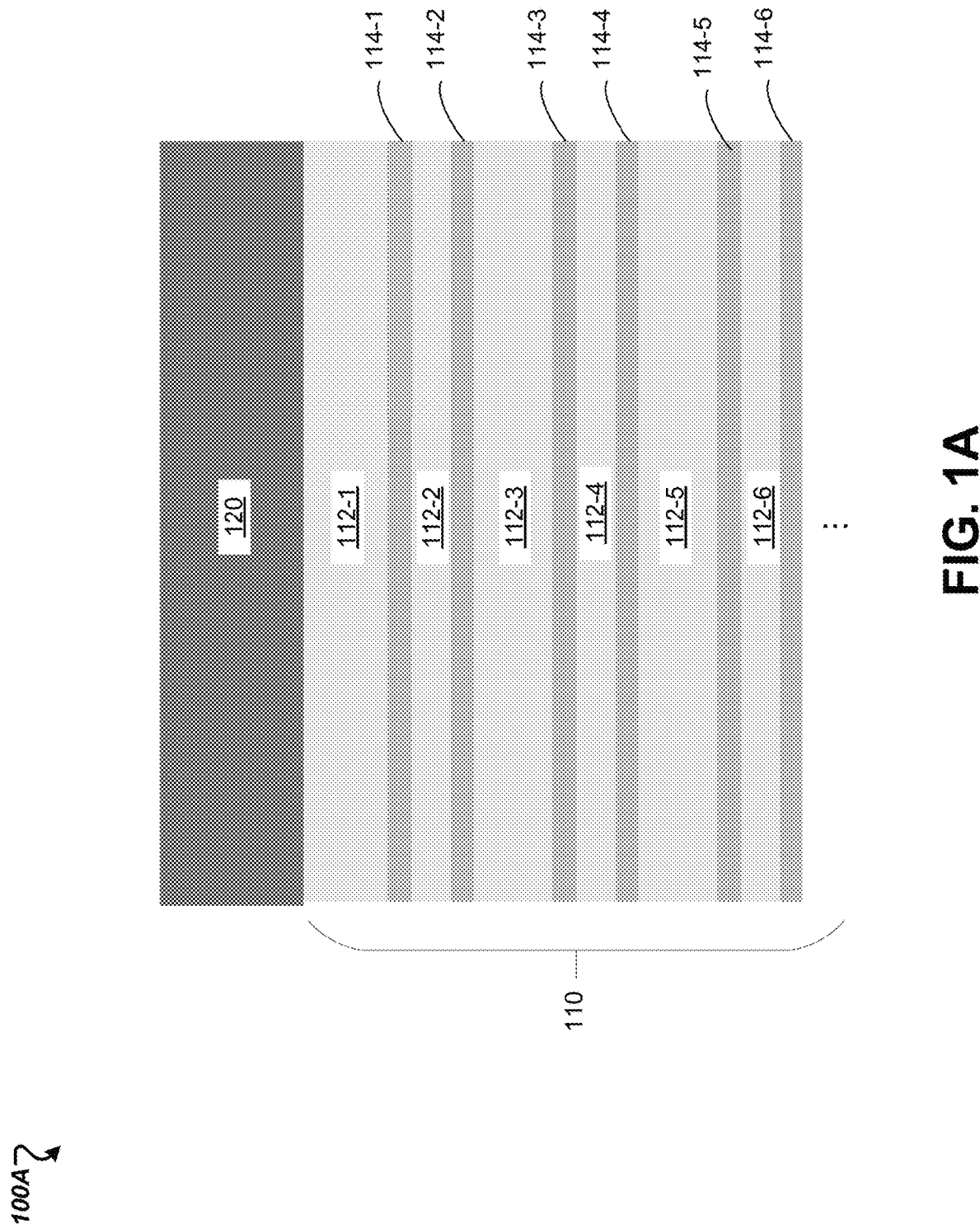

| Gas mix | | | | | Pressure | Source Power | ESC Temperature |
|---|---|---|---|---|---|---|---|
| CF$_4$ | NF$_3$ | H$_2$ | N$_2$ | Ar | 1-50 mTorr | 600-1000 W | 35-75 °C |

| Gas mix | | | | | Pressure | Source Power | ESC Temperature |
|---|---|---|---|---|---|---|---|
| Cl$_2$ | NF$_3$ | HBr | O$_2$ | Ar | 1-50 mTorr | 600-1000 W | 35-75 °C |

| Step | Time (s) | Pressure (mT) | Power (W) Source | Power (W) Bias | Gas Matrix CF$_4$ | NF$_3$ | Cl$_2$ | O$_2$ | H$_2$ | HBr | N$_2$ | Ar | He | ESC Temp |
|---|---|---|---|---|---|---|---|---|---|---|---|---|---|---|
| Low Selectivity Etch | 8-12 | 1-50 | 980 | 210 | ■ | ■ |  |  | ■ |  | ■ | ■ |  | 35-75 °C |
| High Si Selective Etch | 3-7 | 1-50 | 1000 | 0 |  | ■ | ■ | ■ |  | ■ |  | ■ |  | 35-75 °C |
| High SiGe Selective Etch | 3-7 | 50-100 | 600 | 100 | ■ | ■ |  | ■ |  |  |  |  | ■ | 35-75 °C |
| Etch mask removal | 10-30 | 50-100 | 2500 | 0 |  |  |  | ■ |  |  | ■ |  | ■ | 35-75 °C |

US 12,315,733 B2

ENHANCED ETCH SELECTIVITY USING HALIDES

CROSS-REFERENCE TO RELATED APPLICATION(S)

The present application claims the benefit of U.S. Provisional Application 63/443,785, filed on Feb. 7, 2023 and entitled "ENHANCED ETCH SELECTIVITY USING HALIDES", the entire contents of which are incorporated by reference herein.

TECHNICAL FIELD

Embodiments of the present disclosure generally relate to electronic device fabrication. Particularly, embodiments of the present disclosure relate to implementing enhanced etch selectivity using halides during electronic device fabrication.

BACKGROUND

An electronic device manufacturing apparatus can include multiple chambers, such as process chambers and load lock chambers. Such an electronic device manufacturing apparatus can employ a robot apparatus in transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gasses are flowed into the process chamber. Electronic devices, such as semiconductor devices, are manufactured by performing a series of operations that may include deposition, oxidation, photolithography, ion implantation, etch, and so on to form many patterned layers.

SUMMARY

In accordance with an embodiment, a method is provided. The method includes performing a dry etch process to remove a portion of a first layer disposed on a second layer of a stack of alternating layers. The first layer includes a first material and the second layer includes a second material different from the first material, and the dry etch process forms a passivation layer including a byproduct on surfaces of the second material. An amount of first material of the portion of the first layer remains after performing the dry etch process. The method further includes introducing a halide gas to enhance the passivation layer.

In accordance with an embodiment, a method is provided. The method includes forming, from a base structure including an etch mask disposed on a stack of alternating layers, a staircase structure of an electronic device. The stack of alternating layers includes a first layer including a first material disposed on a second layer including a second material different from the first material. Forming the staircase structure includes performing a first dry etch step to remove a portion of the first layer from a region, and performing a second dry etch step to remove a remaining portion of the first layer from the region. Performing the second dry etch step includes performing a dry etch process to form a passivation layer including a byproduct on surfaces of the second material, and introducing a halide gas to enhance the passivation layer.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIGS. 1A-1B are diagrams illustrating cross-sectional views of forming an electronic device implementing enhanced etch selectivity using halides, in accordance with some embodiments.

FIGS. 5A-5C are tables illustrating an example etch process windows, in accordance with some embodiments.

DETAILED DESCRIPTION

Figure 1B:
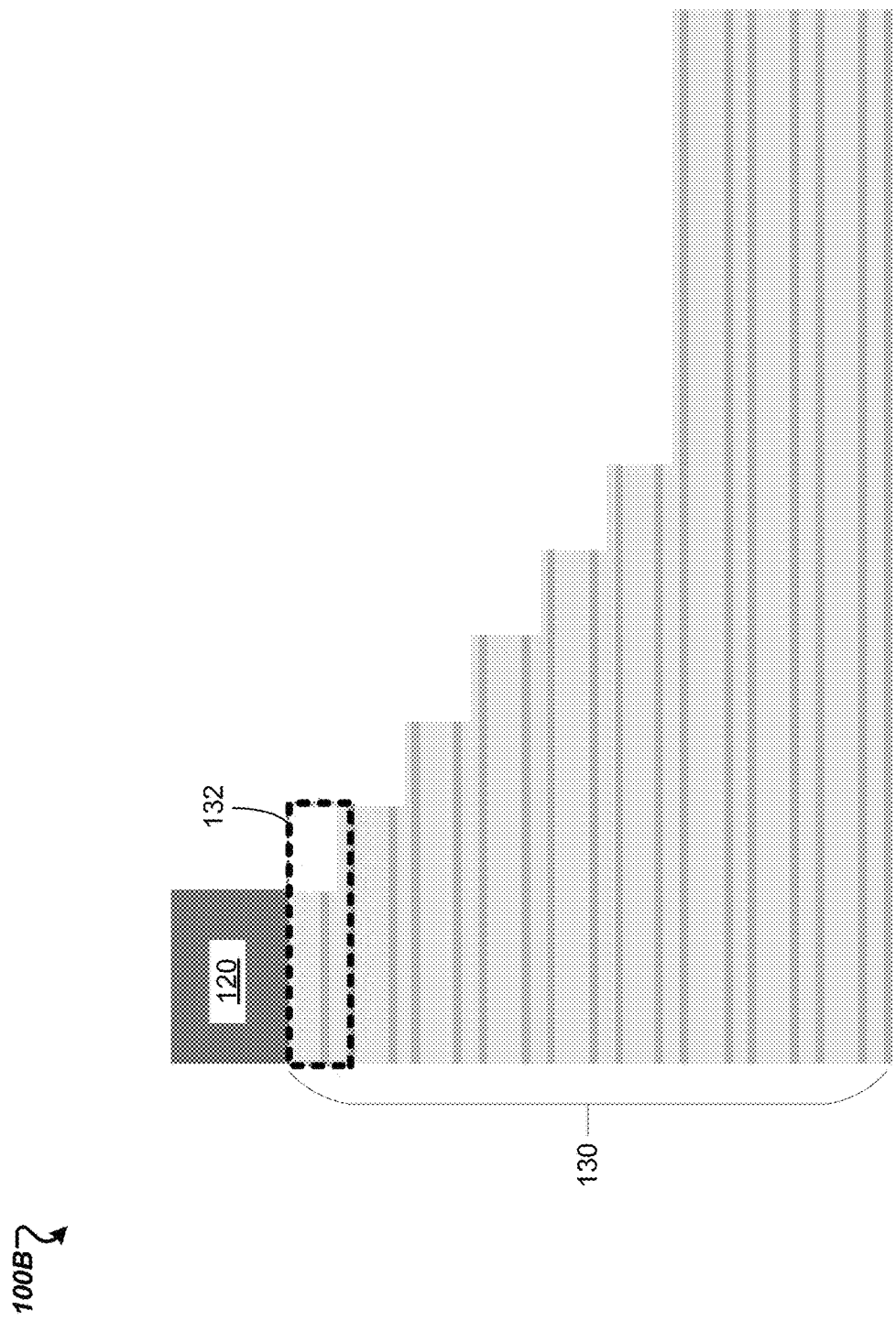

Embodiments described herein relate to implementing enhanced etch selectivity using halides during electronic device fabrication. Etching generally refers to the process of chemically removing layers from a substrate during electronic device fabrication. More specifically, one or more etch masks can be used to protect one or more regions during an etch process, such that exposed regions are etched during the etch process. Examples of masks include softmasks (e.g., photoresists) and hardmasks (e.g., silicon nitride (SiN) hardmasks). For example, etching can be performed after patterning a surface via a lithography process.

One type of etch process is a wet etch process. A wet etch process is an etch process that uses a wet etchant (i.e., liquid-phase etchant). More specifically, a wet etch process can be performed by placing a substrate in a wet etchant bath. Wet etch processes can be isotropic or anisotropic. An isotropic etch process is an etch process in which the etch rate in the vertical direction is approximately equal to etch rate in the lateral direction.

Another type of etch process is a dry etch process. A dry etch process is an etch process that uses a dry etching (i.e., plasma-phase etchant). More specifically, a dry etch process can be performed by utilizing a plasma etchant including a gas that can generate a plasma. The plasma, in turn, produces particles (e.g., free radicals) that are capable of reacting to an exposed surface of the substrate. Many plasma etchants include chlorine (Cl) and/or fluorine (F). Thus, the gas etchant can be selected depending on the material to be etched. Examples of plasma etchants that can be used to etch aluminum (Al) include chlorine gas ($Cl_2$), carbon tetrachloride (tetrachloromethane) ($CCl_4$), silicon tetrachloride (tetrachlorosilane) ($SiCl_4$), boron trichloride ($BCl_3$), etc. Examples of plasma etchants that can be used to etch silicon (Si) include $Cl_2$, $CCl_4$, dichlorodifluoromethane ($CCl_2F_2$), sulfur hexafluoride ($SF_6$), nitrogen trifluoride ($NF_3$), etc. Examples of plasma etchants that can be used to etch silicon dioxide ($SiO_2$) and silicon nitride ($Si_3N_4$) include $CHF_3$, $CF_4$, $SF_6$ $NF_3$, etc. Examples of dry etch processes include plasma etching, ion milling, reactive-ion etching (RIE), etc.

The different etch processes can be performed using different etch process parameters, such as pressure. For example, plasma etching can be performed at higher pressures than RIE, and RIE can be performed at higher pressures than ion milling.

The etch rate of a material generally refers to how quickly the material is removed when exposed to a particular etchant. For example, etch rate can be expressed as a ratio of length to time (e.g., nanometers (nm)/minute (min)). Etch selectivity can generally refer to the ratio of etch rates between materials exposed to the same etchant. In an example, for material X having etch rate Etch Rate 1 and material Y having etch rate 2, etch selectivity can be defined as Etch Rate 1/Etch Rate 2. More specifically, in this example, material X has a selectivity of Etch Rate 1/Etch Rate 2 over material Y.

Some electronic devices can include a staircase structure formed by etching respective portions of a stack of alternating layers for respective numbers of etch cycles. The staircase structure can include a number of steps, where each step corresponds to a respective contact point. Examples of electronic devices that can include a staircase structure include memory devices, and more particularly three-dimensional (3D) memory devices. One example of a memory device that can include a staircase structure is a 3D dynamic random-access memory (DRAM) device.

In an example, a stack can include alternating Si layers and silicon-germanium (SiGe) layers. Preferential etching of Si with respect to SiGe can be a challenge using some etch processes, especially if the Ge content of the SiGe compound is sufficiently low. For example, the Ge content of SiGe can be less than or equal to 10% of the SiGe compound (e.g., the alloy ratio of Si to Ge can be at least 9:1). Ideally, etch selectivity of the material being etched to form the staircase structure should be as high as possible to enable more precise control over the shape of the staircase structure. For example, low selectivity can decrease etch profile control due to, e.g., sidewall damage. Accordingly, some etch processes can require either very narrow process windows, slow etching with poor selectivity and/or the use of different materials, which can lead to the formation of suboptimal staircase structures.

To address these and other drawbacks, embodiments described herein can implement enhanced etch selectivity using halides. Embodiments described herein can be used to form an electronic device that includes a staircase structure. In some embodiments, the electronic device is a 3D DRAM device.

The staircase structure can be formed by dry etching a base structure including an etch mask disposed on a stack of alternating layers. The stack of alternating layers can include a first layer formed from a first material and a second layer formed from a second material. In some embodiments, the first material is Si (i.e., the first layer is an Si layer) and the second material is SiGe (i.e., the second layer is an SiGe layer). For example, the Ge content of SiGe can be less than or equal to 10% of the SiGe compound (e.g., the alloy ratio of Si to Ge can be at least 9:1).

The dry etching can involve a cyclic dry etch process. More specifically, a dry etch process can include a number of dry etch steps that form a cycle. In some embodiments, each dry etch step is an anisotropic etch. The dry etch steps can include a first dry etch step that utilizes a low selectivity etch to remove a portion of material from a region exposing a portion of the first layer, a second dry etch step that utilizes a first high selectivity etch to trim the portion of the first layer and exposing a portion of the second layer, and a third dry etch step that utilizes a second high selectivity etch to trim the portion of the second layer.

The second dry etch step can include a dry etch process that generates a byproduct that forms on surfaces of the second material. More specifically, the byproduct can include a salt that selectively forms on the surface of the second material. The byproduct can withstand decomposition due to the dry etching conditions (e.g., chemistry, temperature and pressure) within the plasma etch chamber. Thus, the byproduct can function as a passivation layer to protect the second material from dry etching and improve etch selectivity with respect to the first material.

It may be the case that some amount of first material being targeted during the second dry etch step remains after the dry etch process. However, the byproduct is subject to erosion due to physical etching or ion bombardment during the dry etching. Thus, the erosion of the byproduct can decrease etch selectivity of the first material over the second material during a subsequent dry etch process that may need to be performed during the second dry etch step.

To address the erosion of the byproduct for maintaining or enhancing etch selectivity of the first material over the second material, embodiments described herein can introduce a halide gas during the dry etching (e.g., between dry etch steps). Instead of acting as a plasma etchant, the halide gas interacts with the byproduct and the surfaces of the second material to enhance the passivation layer via molecular exposure. In some embodiments, enhancing the passivation layer includes at least partially repairing the passivation layer. For example, enhancing the passivation layer can include replenishing the passivation layer (e.g., restoring the passivation layer). That is, the byproduct can serve as an effective nucleation point to initially form the passivation layer, and the halide gas can enhance the passivation layer between dry etch steps. Additionally, the halide gas can saturate reactive and/or etch-damaged sites, which can restore the content of the surfaces of the second material. Accordingly, by maintaining or enhancing etch selectivity of the first layer over the second layer, introduction of the halide gas between etch steps can improve the geometry of the staircase structure formed from the stack of alternating layers.

For example, if the first layer is a Si layer and the second layer is an SiGe layer, then the substrate can be etched with a plasma etchant having a chemistry that, when exposed to Ge on the surface of the second layer, can result in a surface reaction forming a passivation layer including a byproduct. More specifically, the passivation layer can include ammonium hexafluorogermanate ($F_6GeH_8N_2$). Examples of plasma etchants that can be used to etch the SiGe layer include hydrogen gas ($H_2$), $NF_3$, ammonium fluoride ($NH_4F$), etc. The halide gas can be selected to interact with the surface of the SiGe and the byproduct to enhance the passivation layer. In some embodiments, enhancing the passivation layer includes at least partially repairing the passivation layer. For example, enhancing the passivation layer can include replenishing the passivation layer. In some embodiments, the halide gas includes germanium tetrafluoride ($GeF_4$). Further details regarding implementing enhanced etch selectively using halides will be described below with reference to FIGS. 1A-5.

FIGS. 1A-1B are cross-sectional views illustrating an example method of forming an electronic device ("device") implementing enhanced etch selectivity using halides, in accordance with some embodiments. FIG. 1A, illustrates base structure 100A. Base structure 100A includes stack of alternating layers ("stack") 110 and etch mask 120 disposed on substrate 120. For example, obtaining base structure 100A can include forming base structure 100A. Forming base structure 100A can include forming etch mask 120 on stack 110.

Stack 110 includes a plurality of layers of a first material and a plurality of layers of a second material, where a first layer including the first material is disposed on a second layer including the second material. More specifically, the first material can be different from the second material. For example, the plurality of layers of the first material includes layers 112-1 through 112-6 and the plurality of layers of the second material includes layers 114-1 through 114-6. Stack 110 can include any suitable number of layers of the first material and the second material. In some embodiments, the first material is Si and the second material is SiGe. Etch mask 120 can be formed from any suitable material. In some embodiments, etch mask 120 includes a softmask (e.g., photoresist). In some embodiments, etch mask 120 includes a hardmask.

Although not shown in FIG. 1A, base structure 100A further includes one or more additional layers, such that stack 110 is disposed on the one or more additional layers. For example, the one or more additional layers can include a substrate layer as an initial layer of base structure 100A (e.g., a semiconductor wafer). For example, stack 110 can be formed directly on the substrate layer. As another example, one or more intervening layers can exist between stack 110 and the substrate layer.

FIG. 1B includes processed structure 100B. Processed structure 100B includes staircase structure 130 formed by etching stack 110 using etch mask 120. Staircase structure 130 includes a plurality of staircases portion including staircase portion 132-1 disposed on layer 134-1 and layer 132-2 disposed on layer 134-2. More specifically, layers 132-1 and 132-2 can include the first material (e.g., Si) and layers 134-1 and 134-2 can include the second material (e.g., SiGe).

In some embodiments, etching stack 110 includes dry etching stack 110. For example, dry etching stack 110 can include at least one of: plasma etching, ion milling, RIE, etc. More specifically, etching stack 110 can include performing a cyclic etch process to remove a respective amount of material from a respective region of stack 110. A respective plurality of etch cycles can be performed to remove the respective amount of material. In some embodiment, each etch cycle is a dry etch cycle. For example, a dry etch cycle can be a plasma etch cycle, an ion milling cycle, an RIE cycle, etc.

A cyclic etch process can include a first etch process to remove a first portion of material from a region of stack 110 including a respective portion of etch mask 120, a second etch process to remove a second portion of material from the region of stack 110, and a third etch process to remove a third portion of material from the region of stack 110. For example, the first etch process can have low selectivity, the second etch process can have high selectivity with respect to the first material (e.g., Si), and the third etch process can have high selectivity with respect to the second material (e.g., SiGe). Since the portion of etch mask 120 that had protected for the region of stack 110 is removed during the cyclic etch process, the region of stack 110 is left exposed during subsequent cyclic etch processes performed with respect to other regions of stack 110. Thus, the varying number of cyclic etch processes performed for respective regions of stack 110 is what enables the formation of the staircase shape of staircase structure 130. Further details regarding etching stack 110 will now be described in further detail below with reference to FIGS. 2A-2B.

Figure 2A:
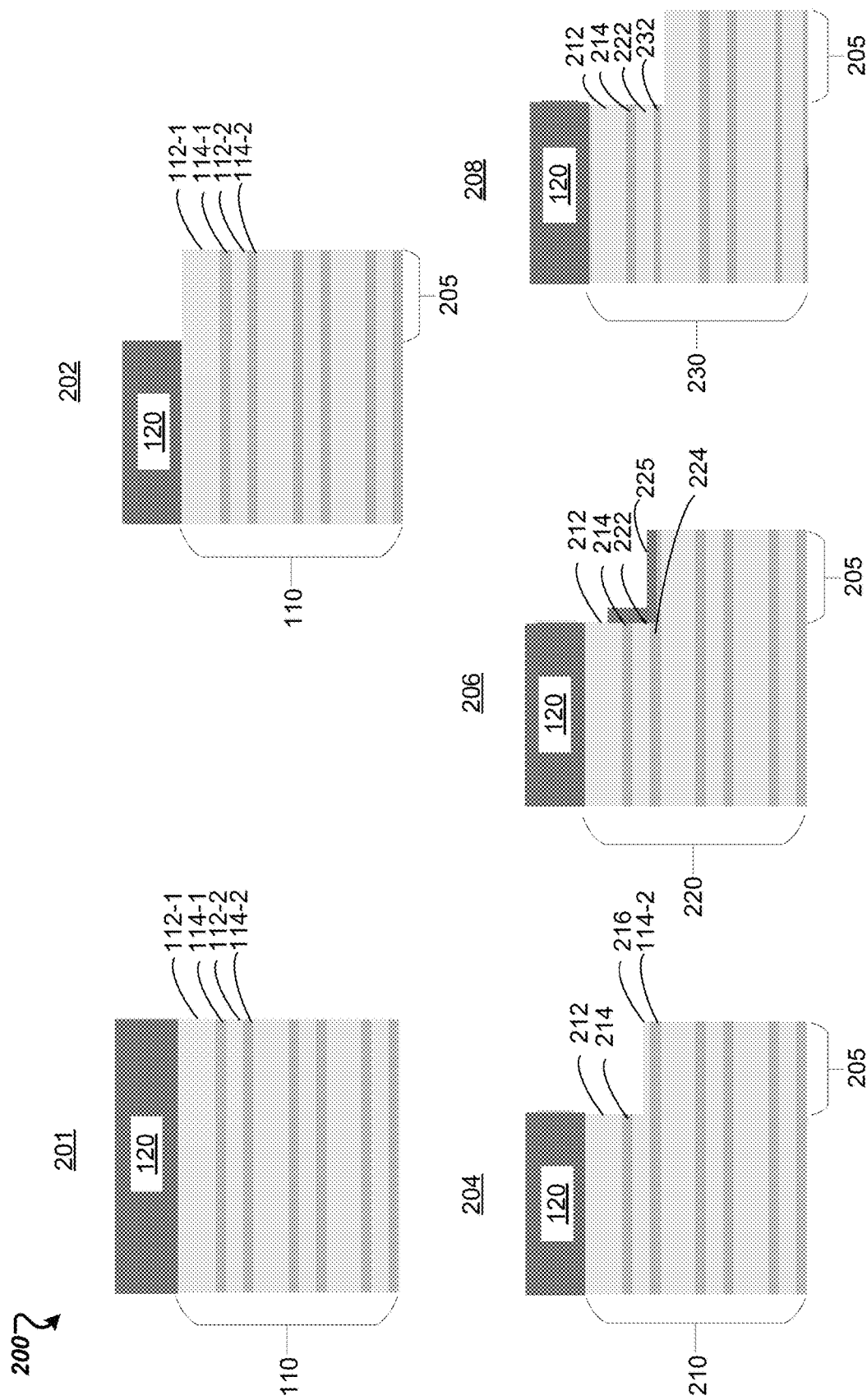
FIGS. 2A-2B are diagrams illustrating cross-sectional views of example methods of implementing enhanced etch selectivity using halides, in accordance with some embodiments.
Figure 2B:
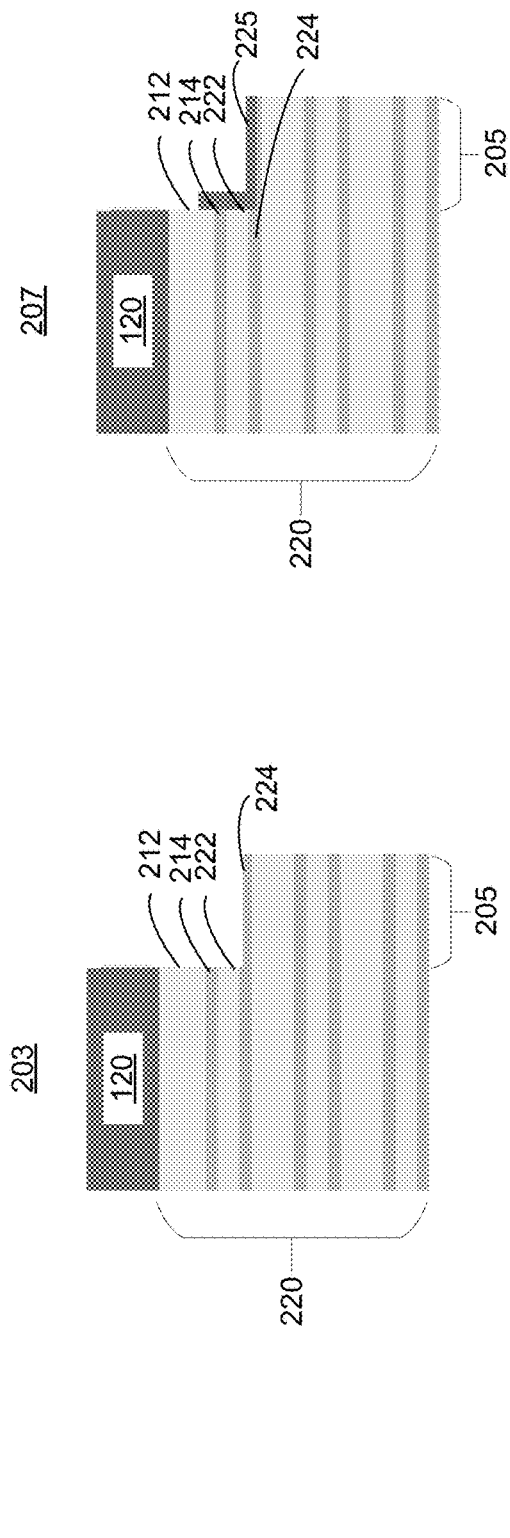

FIG. 2A is a diagram illustrating cross-sectional views of an example method 200 of implementing enhanced etch selectivity using halides, in accordance with some embodiments. As shown, method 200 includes initial step 201 in which a base structure including stack 110 and etch mask 120 disposed on stack 110 is provided. For example, stack 110 can include layers 112-1, 112-2, 114-1 and 114-2 as described above with reference to FIG. 1A.

Method 200 further includes etch steps 202, 204, 206 and 208. During etch step 202, a portion of etch mask 120 is removed (e.g., trimmed) to expose region 205. During etch step 204, a portion of material is removed from region 205. The portion of material removed from region 205 during etch step 204 includes material from layers 112-1, 114-1, 112-2 and 114-2 corresponding to region 205. Etch process 204 results in intermediate structure 210 including layers 212, 214, 216 and 114-2. In some embodiments, etch process 204 is a low selectivity etch process. For example, the etch rate ratio between the first material and the second material can be about 1:1. Material of intermediate structure 210 corresponding to region 205 includes a portion of layer 216 and a portion of layer 114-2.

During etch step 206, another portion of material removed from region 205. The portion of material removed from region 205 during etch step 206 includes a portion of layer 216 corresponding to region 205. In some embodiments, and as shown, a portion of layer 114-2 corresponding to region 205 can also be removed during etch process 204. Thus, etch step 206 can result in intermediate structure 220 including layers 212, 214, 222 and 224, and passivation layer 225. The portion of layer 216 corresponding to region 205 formed during etch step 204 should have a suitable thickness for etch step 206. In some embodiments, the portion of layer 216 corresponding to region 205 has a thickness of less than or equal to about 10 nm. In some embodiments, the portion of layer 216 corresponding to region 205 has a thickness of less than or equal to about 5 nm. Etch step 206 can remove material from the portion of layer 224 corresponding to region 205, such that the portion of layer 224 corresponding to region 205 has a thickness. In some embodiments, the portion of layer 224 corresponding to region 205 has a thickness of less than or equal to about 10 nm. In some embodiments, the portion of layer 224 corresponding to region 205 has a thickness of less than or equal to about 5 nm.

Performing etch step 206 can include performing alternating dry etch processes and passivation layer enhancement processes. For example, with reference to FIG. 2B, performing etch step 206 can include performing dry etch process 203. Dry etch process 203 can be performed with a suitable plasma etchant that can form a byproduct on exposed surfaces of the second material. In some embodiments, the byproduct includes $F_6GeH_8N_2$. The byproduct of dry etch process 203 forms an initial passivation layer. After dry etch process 203 is performed, it is determined whether there is any remaining material of the portion of layer 216 corresponding to region 205. If so, performing etch step 206 can include introducing a halide gas 207 to enhance the initial passivation layer, resulting in passivation layer 225. More specifically, the halide gas interacts with the byproduct and exposed surfaces of the second material to enhance (e.g., at least the initial passivation layer). In some embodiments, enhancing the initial passivation layer includes at least partially repairing the initial passivation layer. For example, enhancing the initial passivation layer can include replenishing the initial passivation layer. In some embodiments, the halide gas includes $GeF_4$. Processes 203 and 207 form a cycle that can repeat continue until the portion of layer 216 corresponding to region 205 is sufficiently removed, resulting in intermediate structure 220 including layer 224.

The introduction of the halide gas and resulting formation of passivation layer 225 can enable etch process 206 to be highly selective with respect to the first material (e.g., Si). For example, etch process 206 can have high Si/SiGe selectivity. In some embodiments, the selectivity of etch process 206 is greater than or equal to about 3 (e.g., the etch rate ratio between the first material and the second material can be about 3:1). In some embodiments, the selectivity of etch process 206 is greater than or equal to about 5 (e.g., the etch rate ratio between the first material and the second material can be about 5:1). In some embodiments, the selectivity of etch process 206 is greater than or equal to about 10 (e.g., the etch rate ratio between the first material and the second material can be about 10:1).

Referring back to FIG. 2A, during etch process 208, another portion of material is removed from region 205. The portion of material moved during etch process 208 includes a portion of layer 224 corresponding to region 205. Thus, etch process 208 can result in intermediate structure 230 including layers 212, 214, 222 and 232. In some embodiments, etch process 208 is highly selective with respect to the second material (e.g., SiGe). For example, etch process 208 can have high SiGe/Si selectivity. In some embodiments, the selectivity of etch process 208 is greater than or equal to about 3 (e.g., the ratio of etch rate of SiGe to the etch rate of Si is greater than or equal to about 3). In some embodiments, the selectivity of etch process 208 is greater than or equal to about 5 (e.g., the ratio of etch rate of SiGe to the etch rate of Si is greater than or equal to about 5). In some embodiments, the selectivity of etch process 208 is greater than or equal to about 10 (e.g., the ratio of etch rate of SiGe to the etch rate of Si is greater than or equal to about 10).

Figure 3:
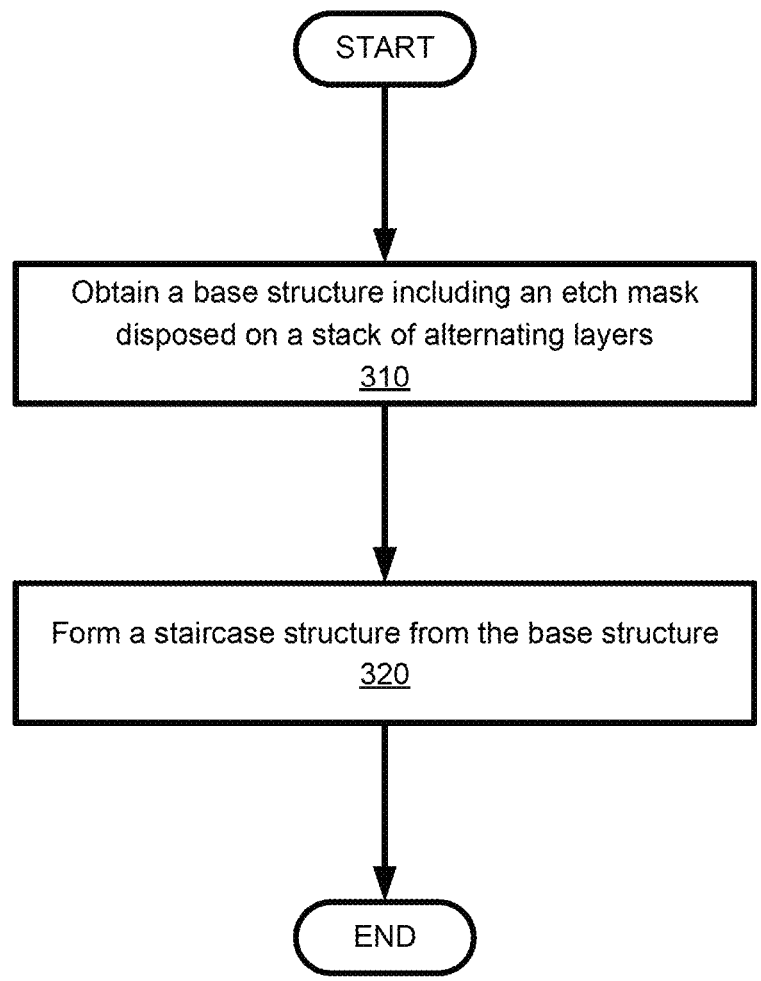
FIG. 3-4B are flowcharts of example methods of implementing enhanced etch selectivity using halides, in accordance with some embodiments.

FIG. 3 depicts an example method 300 of forming an electronic device implementing enhanced etch selectivity using halides, in accordance with some embodiments. Method 300 can be performed within an electronic device processing system. More specifically, method 300 can be performed within one or more process chambers (e.g., etch chambers) of the electronic device processing system.

At step 310, a base structure is provided. The base structure can include a stack of alternating layers and an etch mask disposed on the stack of alternating layers. In some embodiments, providing the base structure include forming the base structure. For example, forming the base structure can include forming the etch mask on the stack.

At step 320, a staircase structure is formed from the base structure. More specifically, the staircase structure is formed from the stack using dry etching. The dry etching can include performing a number of cycles of dry etch steps. Further details regarding steps 310 and 320 are described above with reference to FIGS. 1-2 and will now be described below with reference to FIGS. 4A-4B.

Figure 4A:
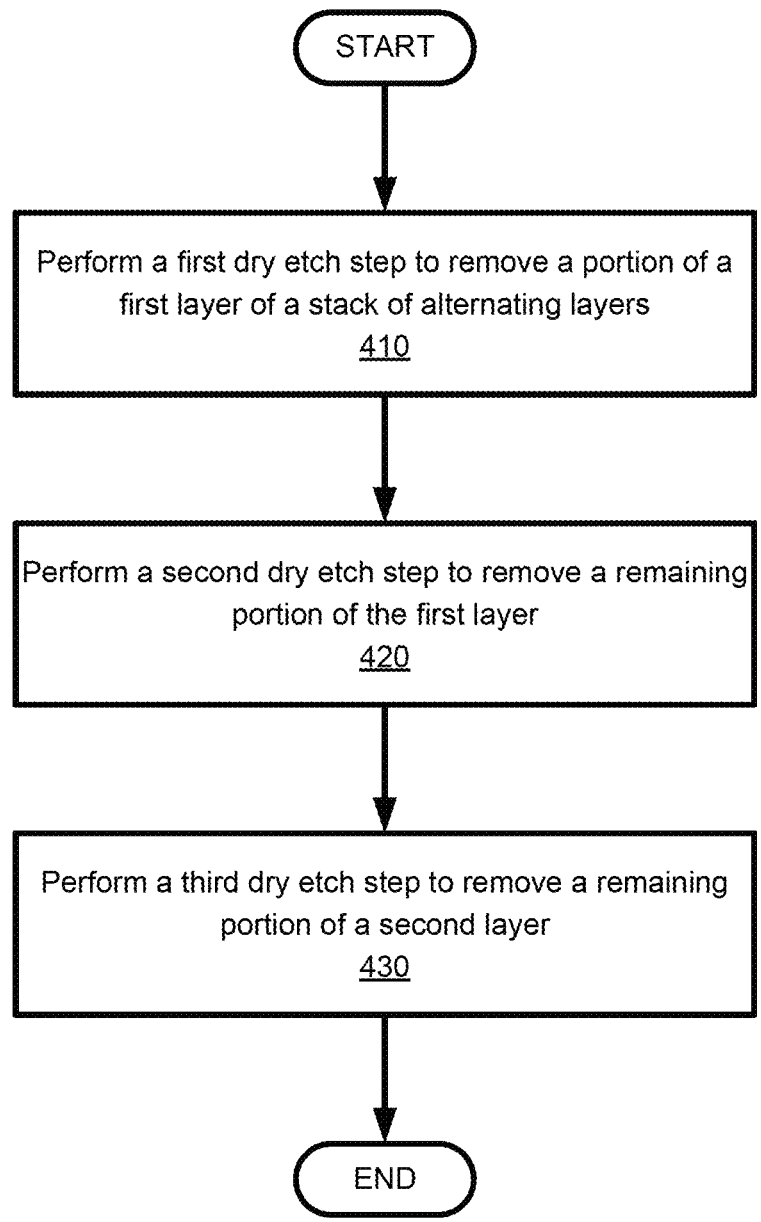
Figure 4B:
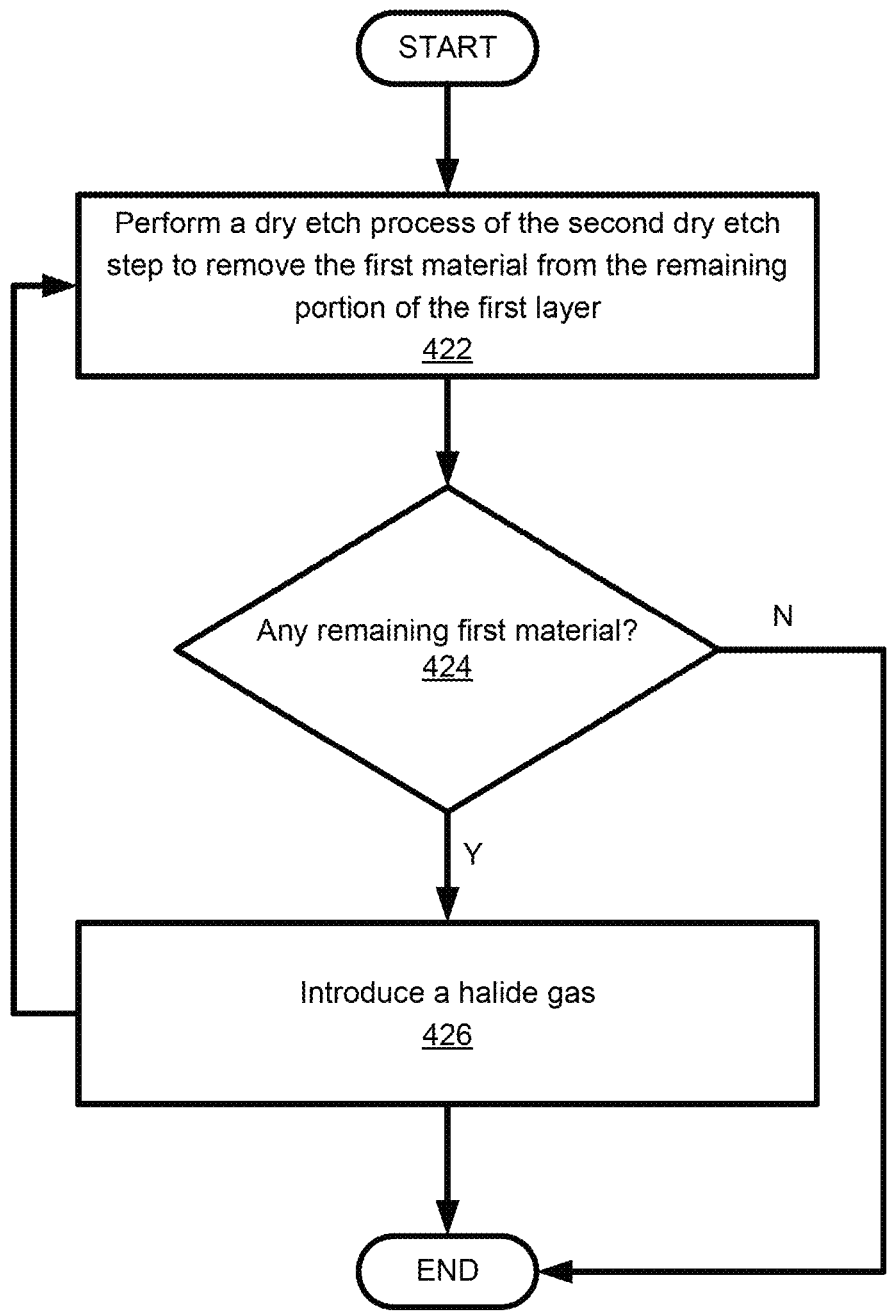

FIGS. 4A-4B depict an example method 400 of implementing enhanced etch selectivity using halides, in accordance with some embodiments. Method 400 can be performed within an electronic device processing system. More specifically, method 400 can be performed within one or more process chambers (e.g., etch chambers) of the electronic device processing system.

At step 410, a first dry etch step is performed to remove a portion of a first layer of a stack of alternating layers. More specifically, the portion of the first layer can correspond to a particular region being etched. The first layer can include a first material. In some embodiments, the first material includes Si and the first layer is a Si layer. In some embodiments, the first dry etch step is a low selectivity etch.

At step 420, a second dry etch step is performed to remove a remaining portion of the first layer and a portion of a second layer of the stack. The second layer can include a second material. In some embodiments, the second material includes SiGe and the second layer is a SiGe layer.

At step 430, a third dry etch step is performed to remove a remaining portion of the second layer. In some embodiments, the third dry etch step is a high selectivity etch with respect to the second material.

For example, as shown in FIG. 4B, performing the second etch step at step 420 can include, at step 422, performing a first dry etch process of the second dry etch step to remove the first material from the remaining portion of the first layer. More specifically, the first dry etch process can be performed using a plasma etchant that results in the formation of a byproduct that forms an initial passivation layer on surfaces of the second material (e.g., $F_6GeH_8N_2$ forming on SiGe surfaces).

At step 424, it is determined whether there is any remaining first material of the remaining portion of the first layer. If not, this means that the second etch step is complete and the process ends (i.e., the process can proceed to step 430 of FIG. 4A to perform the third dry etch step to remove the remaining portion of the second layer). Otherwise, to protect the second material during a subsequent etch process, a halide gas is introduced at step 426 after performing the first dry etch process. The halide gas can interact with the byproduct and the surfaces of the second material to enhance the initial passivation layer (e.g., $GeF_4$ interacting with $F_6GeH_8N_2$ and Ge of the SiGe surfaces). In some embodiments, introducing the halide gas at least partially repairs the initial passivation layer on the surfaces of the second material. For example, introducing the halide gas can replenish the initial passivation layer on the surfaces of the second material. The process can then revert back to step 422 to perform another dry etch process. Since the halide gas exposure has enhanced the passivation layer, the surfaces of the second material are protected during the dry etch process, which can maintain or enhance etch selectivity during the dry etch process. Further details regarding steps 410-430 are described above with reference to FIGS. 1-3.

FIGS. 5A-5C are tables illustrating example etch process windows, in accordance with some embodiments. For example, FIG. 5A is a table 500A illustrating an example high selectivity etch that has high selectivity with respect to a first material. For example, the first material can be Si. The high selectivity etch can employ a gas mix. In some embodiments, and as shown, the gas mix includes $CF_4$, $NF_3$, $H_2$, $N_2$, and Ar. The high selectivity etch can be performed at a pressure. In some embodiments, and as shown, the pressure ranges between about 1 milliTorr (mTorr or mT) to about 50 mTorr. The high selectivity etch can be performed at a source power. In some embodiments, and as shown, the source power ranges between about 600 Watts (W) to about 1000 W. The electrostatic chuck (ESC) holding the substrate during the high selectivity etch can have a temperature. In some embodiments, and as shown, the temperature can range from about 35° C. to about 75° C.

FIG. 5B is a table 500B illustrating an example low selectivity etch that has low selectivity with respect to a first material and a second material. For example, the first material can be Si and the second material can be SiGe. The low selectivity etch process can employ a gas mix. In some embodiments, and as shown, the gas mix includes $Cl_2$, $NF_3$, HBr, $O_2$, and Ar. The low selectivity etch can be performed at a pressure. In some embodiments, and as shown, the pressure ranges between about 1 mTorr to about 50 mTorr. The low selectivity etch can be performed at a source power. In some embodiments, and as shown, the source power ranges between about 600 W to about 1000 W. The ESC holding the substrate during the low selectivity etch can have a temperature. In some embodiments, and as shown, the temperature can range from about 35° C. to about 75° C.

FIG. 5C is a table 500C illustrating an example overview of an etch process to etch a first material and a second material. For example, the first material can be Si and the second material can be SiGe. The etch process can include a number of steps, including a low selectivity etch, a high selectivity etch with respect to the first material, a high selectivity etch with respect to the second material, and etch mask removal.

The low selectivity etch can have a gas mix. In some embodiments, and as shown, the gas mix includes $Cl_2$, $NF_3$, HBr, $O_2$, and Ar. The low selectivity etch can be performed for an amount of time. In some embodiments, and as shown, the amount of time ranges between about 8 seconds (s) to about 12 s. The low selectivity etch can be performed at a pressure. In some embodiments, and as shown, the pressure ranges between about 1 mTorr to about 50 mTorr. The low selectivity etch process can be performed at a source power. In some embodiments, the source power ranges between about 600 W to about 1000 W. For example, as shown, the source power can be about 980 W. The low selectivity etch process can be performed at a bias power. In some embodiments, the bias power ranges between about 100 W to about 500 W. For example, as shown, the bias power can be about 210 W. The ESC holding the substrate during the low selectivity etch process can have a temperature. In some embodiments, and as shown, the temperature can range from about 35° C. to about 75° C.

The high selectivity etch with respect to the first material can have a gas mix. In some embodiments, and as shown, the gas mix includes $CF_4$, $NF_3$, $H_2$, $N_2$, and Ar. The high selectivity etch with respect to the first material can be performed for an amount of time. In some embodiments, and as shown, the amount of time ranges between about 3 s to about 7 s. The high selectivity etch with respect to the first material can be performed at a pressure. In some embodiments, and as shown, the pressure ranges between about 1 mTorr to about 50 mTorr. The high selectivity etch with respect to the first material can be performed at a source power. In some embodiments, the source power ranges between about 600 W to about 1000 W. For example, as shown, the source power can be about 1000 W. The high selectivity etch with respect to the first material can be performed at a bias power. In some embodiments, and as shown, the bias power is about 0 W. The ESC holding the substrate during the high selectivity etch with respect to the first material can have a temperature. In some embodiments, and as shown, the temperature can range from about 35° C. to about 75° C.

The high selectivity etch with respect to the second material can have a gas mix. In some embodiments, and as shown, the gas mix includes $CF_4$, $O_2$, and He. The high selectivity etch with respect to the second material can be performed for an amount of time. In some embodiments, and as shown, the amount of time ranges between about 3 s to about 7 s. The high selectivity etch with respect to the second material can be performed at a pressure. In some embodiments, and as shown, the pressure ranges between about 50 mTorr to about 100 mTorr. The high selectivity etch with respect to the second material can be performed at a source power. In some embodiments, the source power ranges between about 600 W to about 1000 W. For example, as shown, the source power can be about 600 W. The high selectivity etch with respect to the second material can be performed at a bias power. In some embodiments, and as shown, the bias power is about 100 W. The ESC holding the substrate during the high selectivity etch with respect to the second material can have a temperature. In some embodiments, and as shown, the temperature can range from about 35° C. to about 75° C.

The etch mask removal can have a gas mix. In some embodiments, and as shown, the gas mix includes $NF_3$, $O_2$, $N_2$ and He. The etch mask removal can be performed for an amount of time. In some embodiments, and as shown, the amount of time ranges between about 10 s to about 30 s. The etch mask removal can be performed at a pressure. In some embodiments, and as shown, the pressure ranges between about 50 mTorr to about 100 mTorr. The etch mask removal can be performed at a source power. In some embodiments, the source power ranges between about 1000 W to about 3000 W. For example, as shown, the source power can be about 2500 W. The etch mask removal can be performed at a bias power. In some embodiments, and as shown, the bias power is about 0 W. The ESC holding the substrate during the high selectivity etch with respect to the second material can have a temperature. In some embodiments, and as shown, the temperature can range from about 35° C. to about 75° C.

Figure 6:
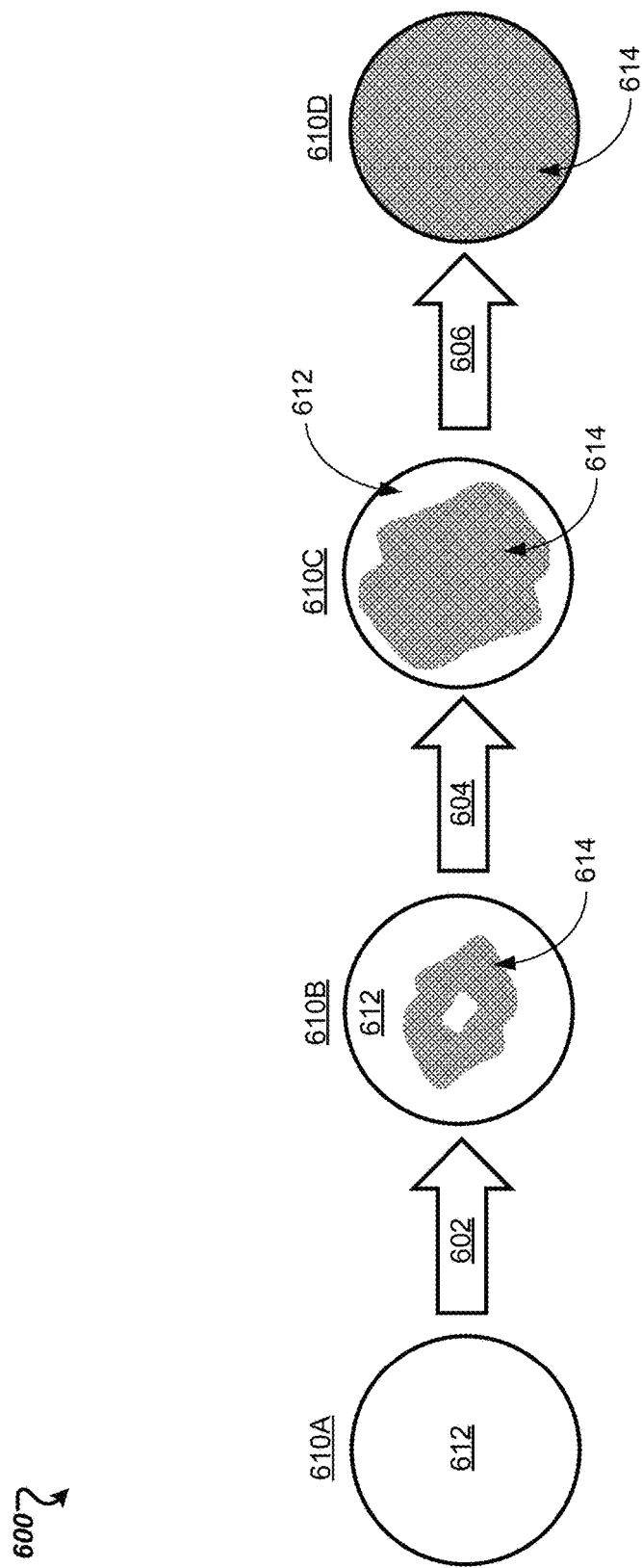
FIG. 6 is a diagram illustrating top-down views of an example process of implementing enhanced etch selectivity using halides, in accordance with some embodiments.

FIG. 6 is a diagram 600 illustrating top-down views of an example process of implementing enhanced etch selectivity using halides, in accordance with some embodiments. As shown, initial substrate 610A is provided that includes first material 612 and second material 614 underneath first material 612 (not shown in 610A). In some embodiments, first material 612 is Si and second material 614 is SiGe. At step 602, a first portion of first material 612 is removed using a dry etch process to expose second material 614 that was underneath the first portion of first material 612. Since not all of first material 612 was removed, at step 604, a second portion of first material 612 is removed using a dry etch process to expose second material 614 that was underneath the second portion of first material 612. Since not all of first material 612 was removed, at step 606, a third portion of first material 612 is removed using a dry etch process to expose second material 614 that was underneath the third portion of first material 612. Between one or more etch processes 602 through 606, a halide gas can be introduced to enhance a passivation layer formed on exposed second material 614. The passivation layer can protect second material 614 from being etched during the dry etch process to remove first material 612, which can improve the selectivity of the dry etch process with respect to first material 612.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
performing a dry etch process to remove a portion of a first layer disposed on a second layer of a stack of alternating layers, wherein the first layer comprises a first material and the second layer comprises a second material different from the first material, wherein the dry etch process forms a passivation layer comprising a byproduct on surfaces of the second material, and wherein an amount of first material of the portion of the first layer remains after performing the dry etch process; and
introducing a halide gas to at least partially repair the passivation layer on the surfaces of the second material.

2. The method of claim 1, further comprising, after introducing the halide gas, performing a second dry etch process to remove a second portion of the first layer.

3. The method of claim 1, wherein the second material comprises germanium (Ge).

4. The method of claim 3, wherein the second material is silicon-germanium (SiGe).

5. The method of claim 1, wherein the first material is silicon (Si).

6. The method of claim 1, wherein the halide gas comprises germanium tetrafluoride ($GeF_4$).

7. The method of claim 1, wherein the passivation layer comprises ammonium hexafluorogermanate ($F_6GeH_8N_2$).

8. The method of claim 1, further comprising performing a first dry etch step to form the portion of the first layer, wherein the dry etch process is performed as part of a second dry etch step after the first dry etch step.

9. The method of claim 8, further comprising performing a third dry etch step to remove a remaining portion of the second layer.

10. The method of claim 9, wherein the first dry etch step, the second dry etch step and the third dry etch step are performed to form a staircase structure of an electronic device.

11. The method of claim 10, wherein the electronic device comprises a three-dimensional dynamic random-access memory (3D DRAM) device.

12. A method comprising:
forming, from a base structure comprising an etch mask disposed on a stack of alternating layers, a staircase structure of an electronic device, wherein the stack of alternating layers comprises a first layer comprising a first material disposed on a second layer comprising a second material different from the first material, and wherein forming the staircase structure comprises:
performing a first dry etch step to remove a portion of the first layer from a region; and
performing a second dry etch step to remove a remaining portion of the first layer from the region, wherein performing the second dry etch step comprises performing a dry etch process to form a passivation layer comprising a byproduct on surfaces of the second material, and introducing a halide gas to enhance at least partially repair the passivation layer on the surfaces of the second material.

13. The method of claim 12, wherein an amount of the portion of the first layer remains after performing the dry etch process.

14. The method of claim 12, wherein the second material comprises germanium (Ge).

15. The method of claim 14, wherein the second material is silicon-germanium (SiGe).

16. The method of claim 12, wherein the first material is silicon (Si).

17. The method of claim 12, wherein the halide gas comprises germanium tetrafluoride ($GeF_4$).

18. The method of claim 12, wherein the passivation layer comprises ammonium hexafluorogermanate ($F_6GeH_8N_2$).

19. The method of claim 12, wherein forming the staircase structure further comprises performing a third dry etch step to remove a remaining portion of the second layer from the region.

20. The method of claim 12, wherein the electronic device comprises a three-dimensional dynamic random-access memory (3D DRAM) device.

* * * * *